United States Patent
Yeh et al.

(10) Patent No.: US 6,996,011 B2
(45) Date of Patent: Feb. 7, 2006

(54) NAND-TYPE NON-VOLATILE MEMORY CELL AND METHOD FOR OPERATING SAME

(75) Inventors: Chih Chieh Yeh, Hsinchu (TW); Wen Jer Tsai, Hsinchu (TW); Tao Cheng Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/855,286

(22) Filed: May 26, 2004

(65) Prior Publication Data

US 2005/0276105 A1     Dec. 15, 2005

(51) Int. Cl.
*G11C 11/34* (2006.01)

(52) U.S. Cl. .............................. 365/185.26; 365/185.17

(58) Field of Classification Search ........... 365/185.26, 365/185.17

See application file for complete search history.

(56) References Cited

U.S. PATENT DOCUMENTS

| | | | | |
|---|---|---|---|---|
| 5,982,667 | A | * | 11/1999 | Jyouno et al. .......... 365/185.22 |
| 6,064,591 | A | * | 5/2000 | Takeuchi et al. ........ 365/185.03 |
| 6,078,519 | A | * | 6/2000 | Kanamitsu et al. .... 365/185.03 |
| 6,097,624 | A | * | 8/2000 | Chung et al. ................ 365/145 |
| 6,178,115 | B1 | * | 1/2001 | Shibata et al. .......... 365/185.03 |
| 6,243,290 | B1 | * | 6/2001 | Kurata et al. .......... 365/185.03 |
| 6,370,062 | B2 | | 4/2002 | Choi |
| 6,434,055 | B2 | | 8/2002 | Tanaka et al. |
| 6,456,528 | B1 | * | 9/2002 | Chen ..................... 365/185.03 |
| 6,721,204 | B1 | * | 4/2004 | Yeh et al. ............... 365/185.24 |
| 6,738,293 | B1 | * | 5/2004 | Iwahashi ................ 365/185.28 |
| 6,867,463 | B2 | * | 3/2005 | Chang ......................... 257/391 |

* cited by examiner

*Primary Examiner*—Michael Tran
(74) *Attorney, Agent, or Firm*—Stout, Uxa, Buyan & Mullins, LLP

(57) ABSTRACT

A NAND-type erasable programmable read only memory (EEPROM) device formed of a number of substantially identical EEPROM cells with each EEPROM cell being capable of storing two bits of information. A simple method for operating the memory comprises erasing, programming, and reading the device.

36 Claims, 14 Drawing Sheets

NAND-TYPE NON-VOLATILE MEMORY CELL AND METHOD FOR OPERATING SAME

This application claims the benefit of foreign priority under 35 U.S.C. Section 119 of European Patent Application No. 03022518.9, filed on Oct. 2, 2003, the contents of which are incorporated herein by reference.

BACKGROUND OF THE INVENTION

1. Field of the Invention

The present invention relates generally to non-volatile memory devices and, more particularly, to methods of operating localized trapped charge memory cell structures capable of storing multiple bits per cell.

2. Description of Related Art

A non-volatile semiconductor memory device is designed to maintain programmed information even in the absence of electrical power. Read only memory (ROM) is a non-volatile memory commonly used in electronic equipment such as microprocessor-based digital electronic equipment and portable electronic devices.

ROM devices typically include multiple memory cell arrays. Each memory cell array may be visualized as including intersecting word lines and bit lines. Each word and bit line intersection can correspond to one bit of memory. In mask programmable metal oxide semiconductor (MOS) ROM devices, the presence or absence of a MOS transistor at word and bit line intersections distinguishes between a stored logic '0' and logic '1'.

A programmable read only memory (PROM) is similar to the mask programmable ROM except that a user may store data values (i.e., program the PROM) using a PROM programmer. A PROM device is typically manufactured with fusible links at all word and bit line intersections. This corresponds to having all bits at a particular logic value, typically logic '1'. The PROM programmer is used to set desired bits to the opposite logic value, typically by applying a high voltage that vaporizes the fusible links corresponding to the desired bits. A typical PROM device can only be programmed once.

An erasable programmable read only memory (EPROM) is programmable like a PROM, but can also be erased (e.g., to an all logic '1's state) by exposing it to ultraviolet light. A typical EPROM device has a floating gate MOS transistor at all word and bit line intersections (i.e., at every bit location). Each MOS transistor has two gates: a floating gate and a non-floating gate. The floating gate is not electrically connected to any conductor, and is surrounded by a high impedance insulating material. To program the EPROM device, a high voltage is applied to the non-floating gate at each bit location where a logic value (e.g., a logic '0') is to be stored. This causes a breakdown in the insulating material and allows a negative charge to accumulate on the floating gate. When the high voltage is removed, the negative charge remains on the floating gate. During subsequent read operations, the negative charge prevents the MOS transistor from forming a low resistance channel between a drain terminal and a source terminal (i.e., from turning on) when the transistor is selected.

An EPROM integrated circuit is normally housed in a package having a quartz lid, and the EPROM is erased by exposing the EPROM integrated circuit to ultraviolet light passed through the quartz lid. The insulating material surrounding the floating gates becomes slightly conductive when exposed to the ultraviolet light, allowing the accumulated negative charges on the floating gates to dissipate.

A typical electrically erasable programmable read only memory (EEPROM) device is similar to an EPROM device except that individual stored bits may be erased electrically. The floating gates in the EEPROM device are surrounded by a much thinner insulating layer, and accumulated negative charges on the floating gates can be dissipated by applying a voltage having a polarity opposite that of the programming voltage to the non-floating gates.

Flash memory devices are sometimes referred to as flash EEPROM devices, and differ from EEPROM devices in that electrical erasure involves large sections of, or the entire contents of, a flash memory device.

A relatively recent development in non-volatile memory is localized trapped charge devices. While these devices are commonly referred to as nitride read only memory (NROM) devices, the acronym "NROM" is a part of a combination trademark of Saifun Semiconductors Ltd. (Netanya, Israel).

Flash memory arrays can be oriented in either NOR or NAND forms. NOR arrays comprise collections of memory elements connected in parallel. NAND arrays comprise collections of memory elements connected in series. It is easier in the NOR configuration than in the NAND configuration to differentiate between programmed and not-programmed sensing current. However, NOR arrays require more semiconductor real estate than do NAND arrays. Therefore, the NAND configuration normally is preferred when high integration density is needed since the NAND configuration can achieve relatively low power operation compared to NOR arrays.

NAND arrays in the prior art have been based upon memory cells that comprise floating gates. These NAND memory cells are capable of storing one bit per cell. The NAND memory cells further require high programming voltages. Programming voltages of 20 volts often are required. Besides, NAND memory cells utilizing floating gates still need complex fabricating process and design circuits.

A need thus exists in the prior art to reduce the voltages required to program NAND memory cells. A further need exists for increasing the storage density of NAND memory cells and reducing the complexity of fabricating process.

SUMMARY OF THE INVENTION

The present invention addresses these needs by providing non-volatile flash memory capable of storing two bits per cell in a NAND array. The fabrication of the NAND array is simple, and the power required to program or erase memory cells is low. The NAND array of the present invention further provides for high density and small pitch in the design.

The invention herein disclosed comprises a method of operating an electrically erasable programmable read only memory (EEPROM) cell. Each EEPROM cell comprises a transistor formed in a substrate and having a source and drain formed in the substrate. One implementation of the method provides that the substrate is grounded. A channel in the substrate connects the source and drain. Each transistor comprises a charge-trapping structure that overlies the channel. The charge-trapping structure comprises a charge-trapping layer disposed between two isolation layers layers. Each transistor further comprises a gate that overlies the charge-trapping structure. Each EEPROM cell is capable of storing two bits of information. One bit is designated as the up bit; the other bit is designated as the down bit. One implementation of the method of operating an EEPROM cell comprises erasing the EEPROM cell, programming the up bit, and programming the down bit.

According to an alternative variation of the method, the EEPROM cell is erased by applying a negative gate-to-substrate erase voltage and allowing the source and drain to float, thereby causing electrons to be injected from the gate and to become trapped in the charge-trapping structure. According to another alternative variation of the method, the EEPROM cell is erased by applying a positive gate-to-substrate erase voltage, thereby causing electrons to be injected from the substrate and to become trapped in the charge-trapping structure.

According to another variation of the method, the up bit of the EEPROM cell is programmed by applying a negative cutoff voltage to the gate. A positive supply voltage is applied to the source. The drain is grounded. This combination of voltages acts to inject holes into the charge-trapping layer of the charge-trapping structure near the source. According to yet another variation of the present method, the down bit of the EEPROM cell is programmed by applying a negative cutoff voltage to the gate. A positive supply voltage is applied to the drain, and the source is grounded. This procedure injects holes into the charge-trapping layer of the charge-trapping structure near the drain.

According to yet another variation of the present method, the up bit may be read. The down bit likewise may be read. An alternative variation of the present method teaches that the up bit is read by applying a sensing voltage to the gate. A positive voltage further is applied to the drain. The source is grounded, and the current in the source or drain is sensed. If the sensed current exceeds a threshold value, then the up bit is declared to be programmed. If the sensed current does not exceed the threshold value, then the up bit is declared to be not programmed.

Still one more variation of the present method provides that the down bit may be read by applying a sensing voltage to the gate. A positive voltage further is applied to the source. The drain is grounded, and the current in the drain or source is sensed. If the sensed current exceeds a threshold value, then the down bit is declared to be programmed. If the sensed current does not exceed the threshold value, then the down bit is declared to be not programmed.

The present invention further comprises a method of operating an electrically erasable programmable read only memory (EEPROM) cell when the EEPROM cell is a member of a NAND string. As before, the EEPROM cell comprises a transistor formed on a substrate. One implementation of the method provides that the substrate is grounded. The transistor comprises a source and a drain formed in the substrate with a channel in the substrate between the source and drain. The transistor further comprises a charge-trapping structure that overlies the channel. The charge-trapping structure comprises a charge-trapping layer disposed between two isolation layers. The transistor further comprises a gate that overlies the charge-trapping structure. Each EEPROM cell so formed is capable of storing two bits of information herein referred to as an up bit and a down bit. The NAND string comprises a series connection of n EEPROM cells connected source to drain. Each cell in the NAND string is substantially identical to said EEPROM cell. The EEPROM cells in the NAND string may be consecutively indexed from one to n wherein n is at least one. The NAND string has an up end and a down end. The up end of the NAND string includes an up string select transistor (SSTU). The SSTU also is formed in the substrate and comprises a source, a drain, and a channel in the substrate between the source and the drain. The SSTU further comprises a dielectric layer that overlies the channel and a gate that overlies the dielectric layer. The drain of the SSTU connects to the source of the EEPROM cell having index one. The source of the SSTU connects to an up bit line (BLU). The gate of the SSTU connects to an up string select line (SSLU). The down end of the NAND string includes a down string select transistor (SSTD). The SSTD is formed in the substrate and comprises a source, a drain, and a channel in the substrate between the source and the drain. The SSTD further comprises a dielectric layer that overlies the channel and a gate that overlies the dielectric layer. The source of the SSTD connects to the drain of the EEPROM cell having index n. The drain of the SSTD connects to a down bit line (BLD). The gate of the SSTD connects to a down string select line (SSLD). Each EEPROM cell in the NAND string has connected to the gate thereof a word line. Each word line is indexed according to the index of the EEPROM cell to which the word line is connected.

An implementation of the method for operating an EEPROM cell that is a member of a NAND string comprises erasing all EEPROM cells in the NAND string and identifying an EEPROM cell in the NAND string. The up bit of the identified EEPROM cell may be programmed. Likewise, the down bit of the identified EEPROM cell may be programmed.

One exemplary method for erasing all EEPROM cells in the NAND string comprises applying a negative erase voltage to all word lines while allowing the BLU, the BLD, the SSLU, and the SSLD to float.

Another implementation of the method for erasing all EEPROM cells in the NAND string comprises applying a positive erase voltage to all word lines, grounding the BLU and the BLD, and applying a positive supply voltage to the SSLU and to the SSLD.

According to another variation of the method for operating an EEPROM cell that is a member of a NAND string, the up bit of the EEPROM cell may be programmed. One way of programming the up bit is to apply a negative cutoff voltage to the word line that connects to the gate of the EEPROM cell. A positive supply voltage is applied to the BLU, to the gate of the SSTU, and to the gate of the SSTD. The BLD is grounded. A large positive voltage is applied to all word lines except the word line connected to the gate of the EEPROM cell to be programmed.

Yet another variation of the method for operating an EEPROM cell that is a member of a NAND string provides that the down bit of the EEPROM cell may be programmed. According to an implementation of the method of the present invention, the down bit is programmed by applying a negative cutoff voltage to the word line that connects to the gate of the EEPROM cell. A positive supply voltage is applied to the BLD, to the gate of the SSTU, and to the gate of the SSTD. The BLU is grounded. A large positive voltage is applied to all word lines except the word line connected to the gate of the identified EEPROM cell.

The method of the present invention further provides for reading the up bit and the down bit of an EEPROM cell, which is a member of a NAND string. One implementation of the method for reading the up bit comprises applying a sensing voltage to the word line connected to the gate of the EEPROM cell. A positive supply voltage is applied to all remaining word lines. Another positive voltage is applied to the BLD. The BLU is grounded, and the current in the drain of the SSTU or the current in the source of the SSTD is sensed. If the sensed current exceeds a threshold value, then the up bit of the EEPROM cell is declared to be programmed. If the threshold value is not exceeded by the sensed current, then the up bit of the EEPROM cell is declared to be not programmed.

The down bit also may be read according to one implementation of the method of the present invention. According to this variation, reading the down bit comprises applying a sensing voltage to the word line connected to the gate of the EEPROM cell. A positive supply voltage is applied to all remaining word lines. Another positive voltage is applied to the BLU. The BLD is grounded, and the current in the source of the SSTD or the current in the drain of the SSTU is sensed. If the sensed current exceeds a threshold value, then the down bit of the EEPROM cell is declared to be programmed. If the threshold value is not exceeded by the sensed current, then the down bit of the EEPROM cell is declared to be not programmed.

The present invention still further comprises a NAND-type erasable programmable read only memory (EEPROM) device. One embodiment of the EEPROM device comprises a plurality of substantially identical NAND strings formed in a substrate. Each NAND string has an up end and a down end. Each NAND string comprises a plurality of EEPROM cells indexed from one to n connected in series. EEPROM cells in different NAND strings but with the same index connect to a word line. The word line is identified by the same index as that of the EEPROM cells to which the word line is connected. The EEPROM device further comprises a BLU associated with each NAND string and a BLD likewise associated with each NAND string. The EEPROM device still further comprises an SSTU disposed between the up end of each NAND string and the BLU associated with the NAND string. The EEPROM device further comprises an SSTD disposed between the down end of each NAND string and the BLD associated with the NAND string. According to one alternative embodiment of the NAND-type EEPROM device, each EEPROM cell is capable of storing two bits of information.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Figure 1:
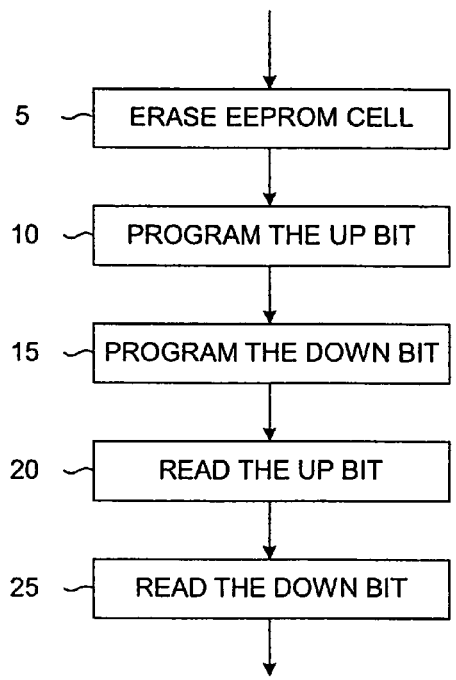
FIG. 1 is a flow diagram of an exemplary method of operating an electrically erasable programmable read only memory (EEPROM) cell according to the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of non-volatile memory cells. The present invention may be practiced in conjunction with various integrated circuit fabrication techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to a method of erasing, programming and reading a memory cell and to a method of fabricating a memory cell.

Referring more particularly to the drawings, FIG. 1 is a flow diagram of an exemplary method of operating a non-volatile memory cell according to the present invention. In accordance with one aspect of the present invention, the non-volatile memory cell comprises a trapped charge memory cell capable of storing multiple bits per cell. In the illustrated embodiment, the non-volatile memory cell comprises an electrically erasable programmable read only memory (EEPROM) cell. According to this exemplary method, the EEPROM cell is erased at step 5 using for example positive or negative Fowler-Nordheim tunneling. An up bit in the transistor then may be programmed, e.g., set to a non-erased state, at step 10. Further, a down bit in the transistor likewise may be programmed at step 15. The meaning of the up bit and the down bit in the EEPROM cell now will be explained.

Figure 2:
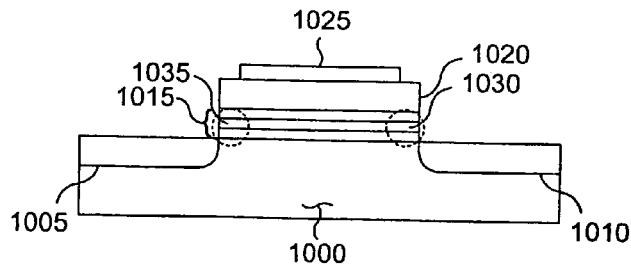
FIG. 2 is a cross-sectional diagram of an exemplary embodiment of an EEPROM cell fabricated according to the present invention.

FIG. 2 is a cross-sectional diagram of an exemplary embodiment of an EEPROM cell fabricated according to the present invention. According to this exemplary embodiment, the EEPROM cell comprises a transistor formed on a substrate 1000. The substrate may comprise silicon. The substrate further may be doped with holes. A substrate doped with holes is referred to as a p-type substrate. The transistor comprises a source region 1005 and a drain region 1010. The source and drain regions (1005, 1010) may be heavily doped with n-type impurities. Accordingly, these regions may be designated as n+ type regions. The region of the substrate between the source 1005 and the drain 1010 is referred to as the channel of the transistor. A charge-trapping structure 1015 overlies the channel. In the illustrated embodiment, the charge-trapping structure 1015 comprises three relatively thin layers comprising a first isolation layer, a charge-trapping layer, and a second isolation layer. According to a typical embodiment of the charge-trapping structure 1015, the first isolation layer overlies the channel, the charge-trapping layer overlies the first isolation layer, and the second isolation layer overlies the charge-trapping layer. Normally, silicon dioxide forms the first and second isolation layers, and silicon nitride forms the charge-trapping layer. A conducting layer referred to as the gate 1020 overlies the charge-trapping structure 1015. A contact 1025 for the gate 1020 also is provided in the illustrated embodiment.

In one example of normal operation of the transistor just described, the substrate 1000 may be grounded. Typically, a voltage applied to the gate, source, or drain of an EEPROM cell is measured with respect to the substrate. The potential of the substrate may be referred to as "ground" in such a typical situation. An external circuit comprising a voltage source may be connected to the drain 1010 such that the potential of the drain 1010 is made positive with respect to ground. The source 1005 may be grounded in this example. When so configured, current that flows in the channel between the source 1005 and the drain 1010 can be controlled by the voltage applied between the gate 1020 and the source 1005. The current that flows in the channel (referred to as the drain current) can be observed in the external circuit connected to the drain 1010. (According to one illustrative embodiment, the voltage is applied between the gate contact 1025 and the source 1005. Whether the voltage is applied to the gate 1020 or to the gate contact 1025 makes no difference in the operation of the transistor.) When the gate-to-source voltage is zero, essentially no current flows in the channel. Hence, zero drain current is observed. As the gate-to-source voltage increases, the drain current continues to be essentially zero until a threshold voltage, $V_t$, is reached. (The value of $V_t$ depends upon many details in the fabrication of the transistor, but may typically have a value less than one volt.) When the gate-to-source voltage exceeds $V_t$, drain current is established that increases with increasing gate-to-source voltage.

In prior art floating gate EEPROM cells, information is stored in the EEPROM cell by causing changes in the value of the threshold voltage, $V_t$, of the transistor. For example, if $V_t$ has a value of 0.5 volts, then applying 1.5 volts to the gate of the transistor would result in a large value of drain current that can be sensed. As another example, if $V_t$ has a value of 3 volts, then applying 1.5 volts to the gate of the transistor results in essentially zero drain current. One bit of information can be stored in floating gate prior art EEPROM cells by controlling the value of $V_t$. One way of increasing the value of $V_t$ is to cause an excess of electrons to accumulate on the floating gate. According to one way of using a prior art floating gate EEPROM cell, the cell may be said to be "erased" when an excess of electrons is present on the floating gate. An erased floating gate EEPROM cell has a high $V_t$, so essentially zero drain current results if a nominal positive voltage is applied to the gate.

A prior art floating gate EEPROM cell may be said to be "programmed" when no excess of electrons are present on the floating gate. A programmed floating gate EEPROM cell has a low $V_t$, so a non-zero drain current results when a nominal positive voltage is applied to the gate. A prior art floating gate EEPROM cell thus can assume two states, an erased state and a programmed state. By assigning, for example, a logic "1" to the erased state and a logic "0" to the programmed state, it should be noted that the prior art floating gate EEPROM cell can store one bit of information.

One bit of information is associated with any quantity that can assume one of two equally likely values. Other examples of devices that can store binary values are the ON/OFF state of a light switch, N/S magnetization of a magnet, the HIGH/LOW condition of a voltage, and the like. Each of these examples is presented for the purpose of illustration only and none is intended to limit the scope of the present invention.

The charge-trapping layer of the charge-trapping structure 1015 in the EEPROM cell of the present invention has the fortunate property that it is able to store charge in highly localized areas. For example, according to one embodiment, the area 1030 of the charge-trapping layer near the drain 1010 of the transistor can store one charge value. The area 1035 of the charge-trapping layer near the source 1005 of the transistor can store a separate charge value.

Each of the two regions of the charge-trapping layer just described can be caused to hold either an excess of electrons (negative charge) or no excess electrons (neutral charge). According to one example similar to that chosen for the prior art floating gate EEPROM already described, the excess of electrons condition may be referred to as the "erased state." The condition where no excess of electrons is present may be referred to as the "programmed state." The EEPROM cell of the present invention has two regions (1030, 1035) in the nitride layer that can be either programmed or erased. It should be clear that an EEPROM cell according to the present invention can store two bits of information. In that which follows, the region 1035 of the charge-trapping layer near the source 1005 will be used to store an "up bit," and the region 1030 of the charge-trapping layer near the drain 1010 will be used to store a "down bit."

Continuing with the variation of the method depicted in FIG. 1, an EEPROM cell may be interrogated by reading the up bit at step 20 and reading the down bit at step 25. The reading can comprise determining whether the respective bit is programmed.

Figure 3:
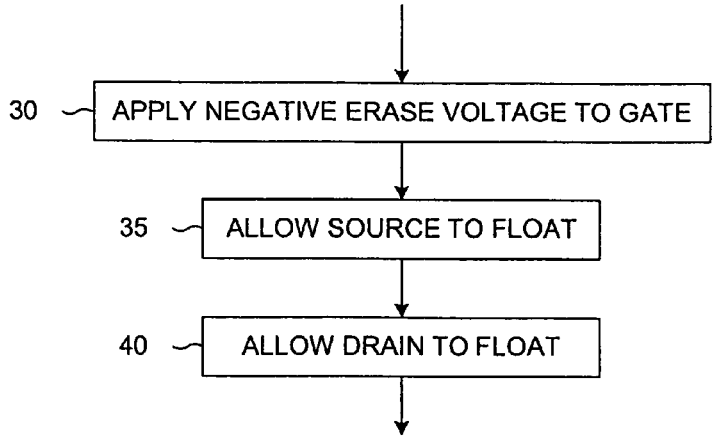
FIG. 3 is a flow diagram of an exemplary method of erasing an EEPROM cell according to the present invention.

FIG. 3 is a flow diagram of an exemplary method of erasing an EEPROM cell according to the present invention. This exemplary method may be used to erase both bits of an EEPROM cell. According to one implementation of the present exemplary method, Fowler-Nordheim tunneling is implemented, and a negative gate-to-substrate erase voltage is applied to the gate of the EEPROM cell at step 30. According to an exemplary embodiment, a negative erase voltage of about −18 volts is used. The source of the EEPROM cell is allowed to float at step 35. The drain of the EEPROM cell likewise is allowed to float at step 40. In modified embodiments for the present and below disclosure regarding erasing, the substrate can be positive or grounded with a negative erase voltage being applied to the gate. Referring again to FIG. 2, the present steps of the method cause an excess of electrons to be injected from the gate 1020 and to become trapped in both regions (1030, 1035) of the charge-trapping layer. The excess of electrons corresponds to an erased state for both regions (1030, 1035). Both the up bit and the down bit are therefore said to be erased.

FIG. 4 is a simplified schematic diagram that describes voltages applied to an EEPROM cell in order to operate the cell according to the present invention. FIG. 4A illustrates the application of a negative erase voltage 3000 to the gate (G) of the EEPROM cell with the source (S) and the drain (D) floating.

Figure 4A:
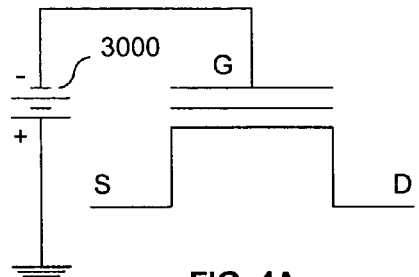
FIGS. 4A–4F are simplified schematic diagrams describing voltages applied to EEPROM cells in order to operate the cells according to the present invention.
Figure 4B:
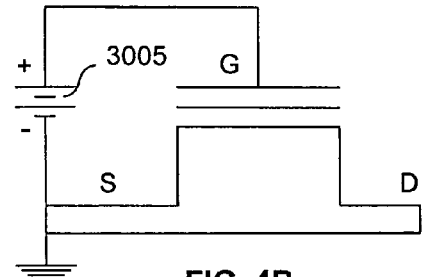
Figure 5:
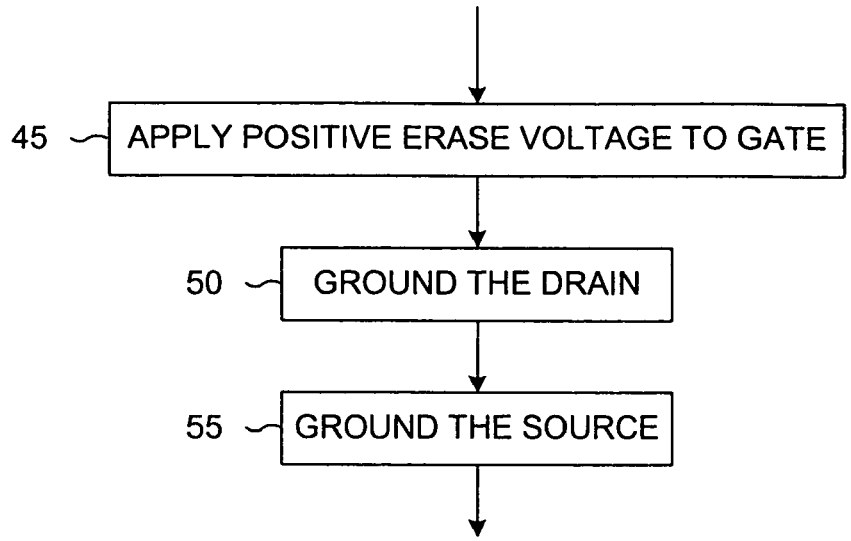
FIG. 5 is a flow diagram of one alternative exemplary method of erasing an EEPROM cell according to the present invention.

FIG. 5 is a flow diagram of an alternative exemplary method of erasing an EEPROM cell according to the present invention. According to this variation of the present method, Fowler-Nordheim tunneling is implemented, and a positive gate-to-substrate erase voltage is applied to the gate of the EEPROM cell at step 45. According to one exemplary embodiment, a positive erase voltage of about 18 volts is used. The source of the EEPROM cell is grounded at step 50. The drain of the EEPROM cell likewise is grounded at step 55. In modified embodiments for the present and below disclosure regarding erasing, the substrate can be biased with a negative potential with a positive or ground potential being applied to the gate. Referring once again to FIG. 2, the present steps of the method cause an excess of electrons to be injected from the substrate 1000 and to become trapped in both regions (1030, 1035) of the nitride. The excess of electrons corresponds to an erased state for both regions (1030, 1035). Both the up bit and the down bit again are therefore said to be erased. FIG. 4B illustrates the application of a positive erase voltage 3005 to the gate (G) of the EEPROM cell with the source (S) and the drain (D) grounded. In a typical embodiment, the voltage of source and drain is allowed to be equal to the voltage of substrate.

Figure 4C:
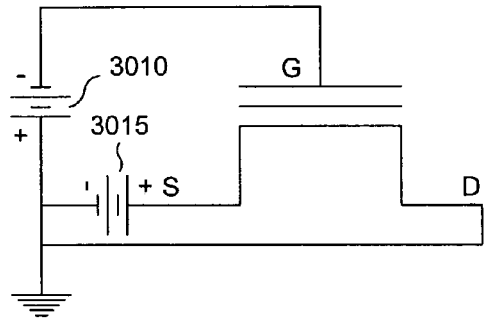
Figure 6:
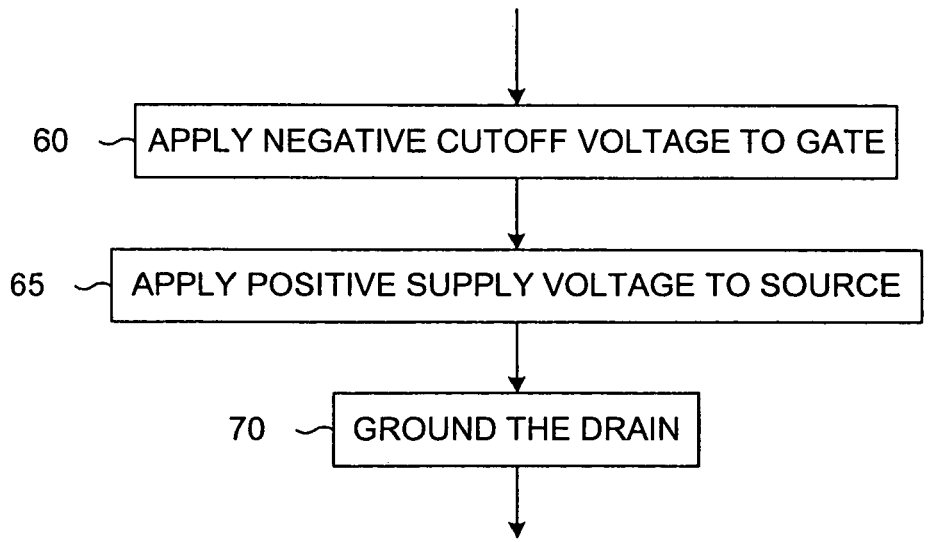
FIG. 6 is a flow diagram of one exemplary method of programming the up bit of an EEPROM cell according to the present invention.

FIG. 6 is a flow diagram of an exemplary method of programming the up bit of an EEPROM cell according to the present invention. According to this exemplary method, the substrate is grounded and a negative cutoff voltage is applied to the gate of the EEPROM cell at step 60. In a modified embodiment, the substrate can be biased with a positive potential. A positive supply voltage is applied to the source of the EEPROM cell at step 65, and the drain of the EEPROM cell is grounded at step 70. According to one exemplary embodiment of the EEPROM cell, a negative cutoff voltage of about −5 volts is used. The positive supply voltage according to this exemplary embodiment may be about 5 volts. Applying the voltages just described to the EEPROM cell of FIG. 2 causes holes to be injected from the substrate into the up bit region 1035 of the charge-trapping layer. A "hole" is an absence of an electron on an atom in a semiconductor. A hole carries a positive charge equal and opposite to the charge on an electron. The holes that are injected into the up bit region 1035 of the charge-trapping layer recombine with or compensate for electrons in the up bit region 1035. This recombining or compensating tends to neutralize excess electrons in the up bit region 1035. The up bit region 1035 therefore assumes the programmed state. FIG. 4C illustrates the application of a negative cutoff voltage 3010 to the gate (G) of the EEPROM cell with a positive supply voltage 3015 applied to the source (S) and with the drain (D) grounded.

Figure 4D:
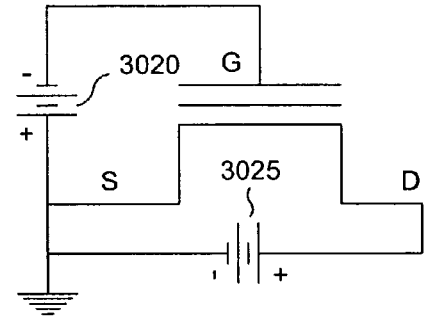
Figure 7:
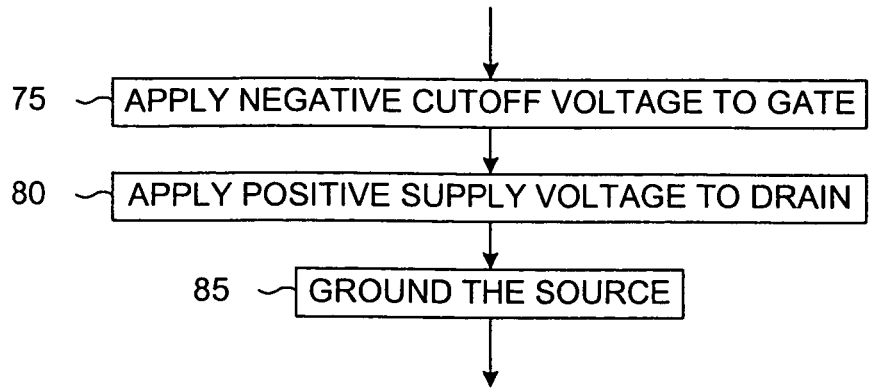
FIG. 7 is a flow diagram of an exemplary method of programming the down bit of an EEPROM cell according to the present invention.

FIG. 7 is a flow diagram of an exemplary method of programming the down bit of an EEPROM cell according to the present invention. According to this exemplary method, the substrate again is grounded, and a negative cutoff voltage again is applied to the gate of the EEPROM cell at step 75. In a modified embodiment, the substrate can be biased with a positive potential. A positive supply voltage is applied to the drain of the EEPROM cell at step 80. The source of the EEPROM cell is grounded at step 85. According to an exemplary embodiment of the EEPROM cell, a negative cutoff voltage of about −5 volts and a positive supply voltage of about 5 volts can be used. Applying the voltages just described to the EEPROM cell of FIG. 2 causes holes to be injected from the substrate into the down bit region 1030 of the nitride layer. The holes that are injected into the down bit region 1030 of the charge-trapping layer recombine with or compensate for electrons in the down bit region 1030, tending to neutralize the effect of excess electrons in the down bit region 1030. The down bit region 1030 therefore assumes the programmed state. FIG. 4D illustrates the application of a negative cutoff voltage 3020 to the gate (G) of the EEPROM cell with a positive supply voltage 3025 applied to the drain (D) and with the source (S) grounded.

Figure 4E:
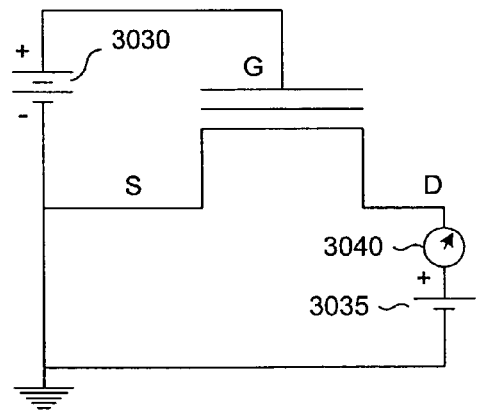
Figure 8:
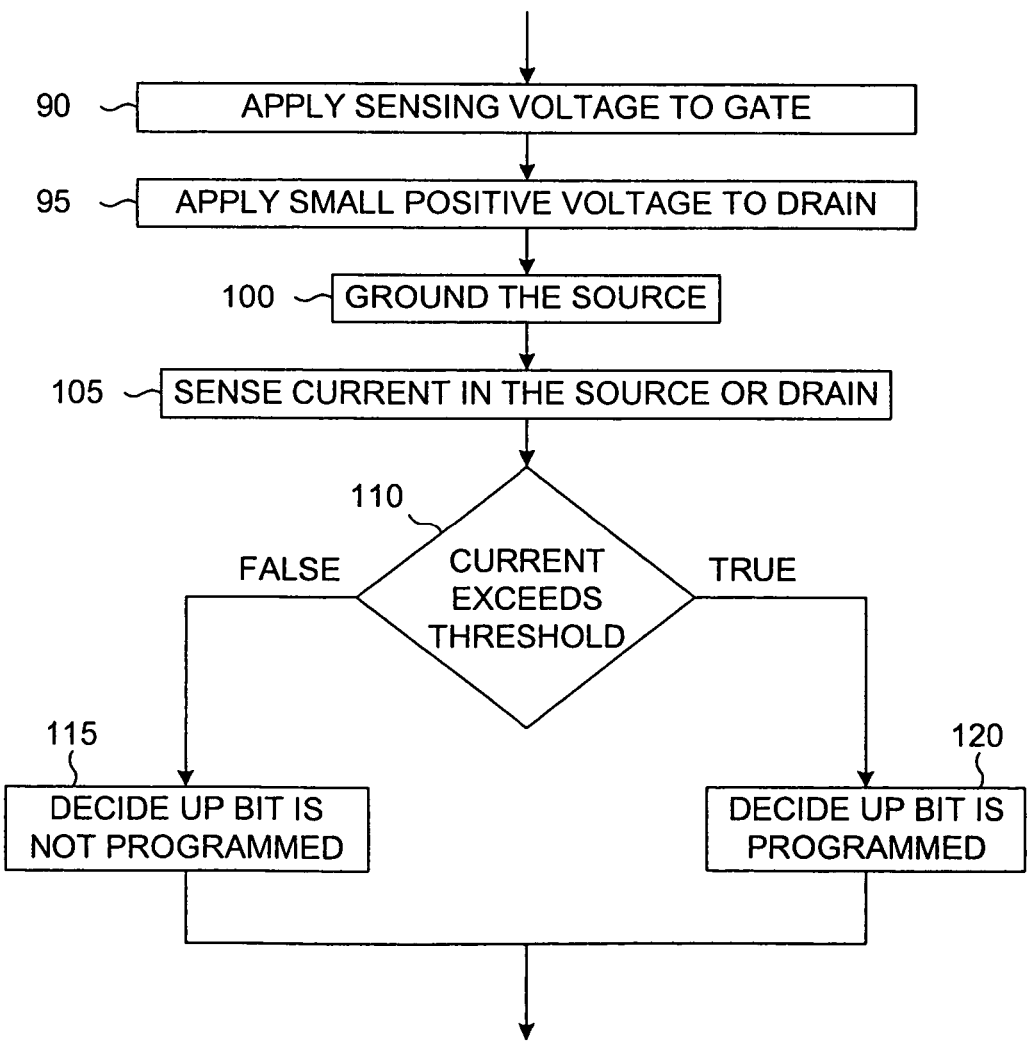
FIG. 8 is a flow diagram of an exemplary method of reading the up bit of an EEPROM cell according to the present invention.

FIG. 8 is a flow diagram of an exemplary method of reading the up bit of an EEPROM cell according to the present invention. According to an implementation of this exemplary method, the substrate is grounded and a sensing voltage is applied to the gate of the EEPROM cell at step 90. In a modified embodiment, the substrate can be biased with a positive potential. A small positive voltage is applied to the drain of the EEPROM cell at step 95. The source of the EEPROM cell is grounded at step 100. With the above voltages applied, the current in the source is sensed at step 105. (According to an alternative variation of the method, the current in the drain is sensed.) Generally, the current in the drain is essentially zero if the up bit is not programmed. If the up bit is programmed, then, as already described herein, a measurable current is observed in the drain. To be more precise, a "threshold" current is defined such that current is said to be present when the value of current exceeds the threshold value. When current does not exceed the threshold, then the current is declared to be zero. According to an exemplary embodiment, a typical value for threshold current is about 10 μA. According to an implementation of the present method, the sensed value of current is compared with the threshold value at step 110. If the current does not exceed the threshold, a decision is made declaring that the up bit is not programmed at step 115. If the current exceeds the threshold, a decision is made declaring that the up bit is programmed at step 120. FIG. 4E illustrates the application of a sensing voltage 3030 to the gate (G) of the EEPROM cell with a small positive voltage 3035 applied to the drain (D) and with the source (S) grounded. Current sensor 3040 senses the drain current. In an alternative embodiment, the source current is sensed.

Figure 4F:
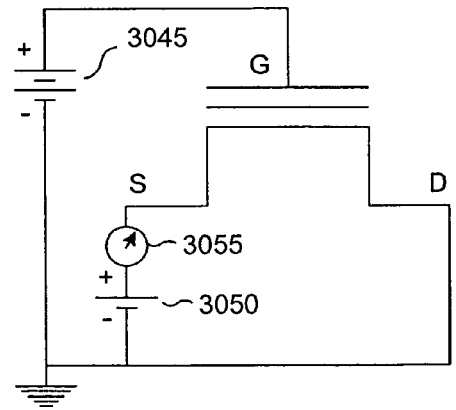
Figure 9:
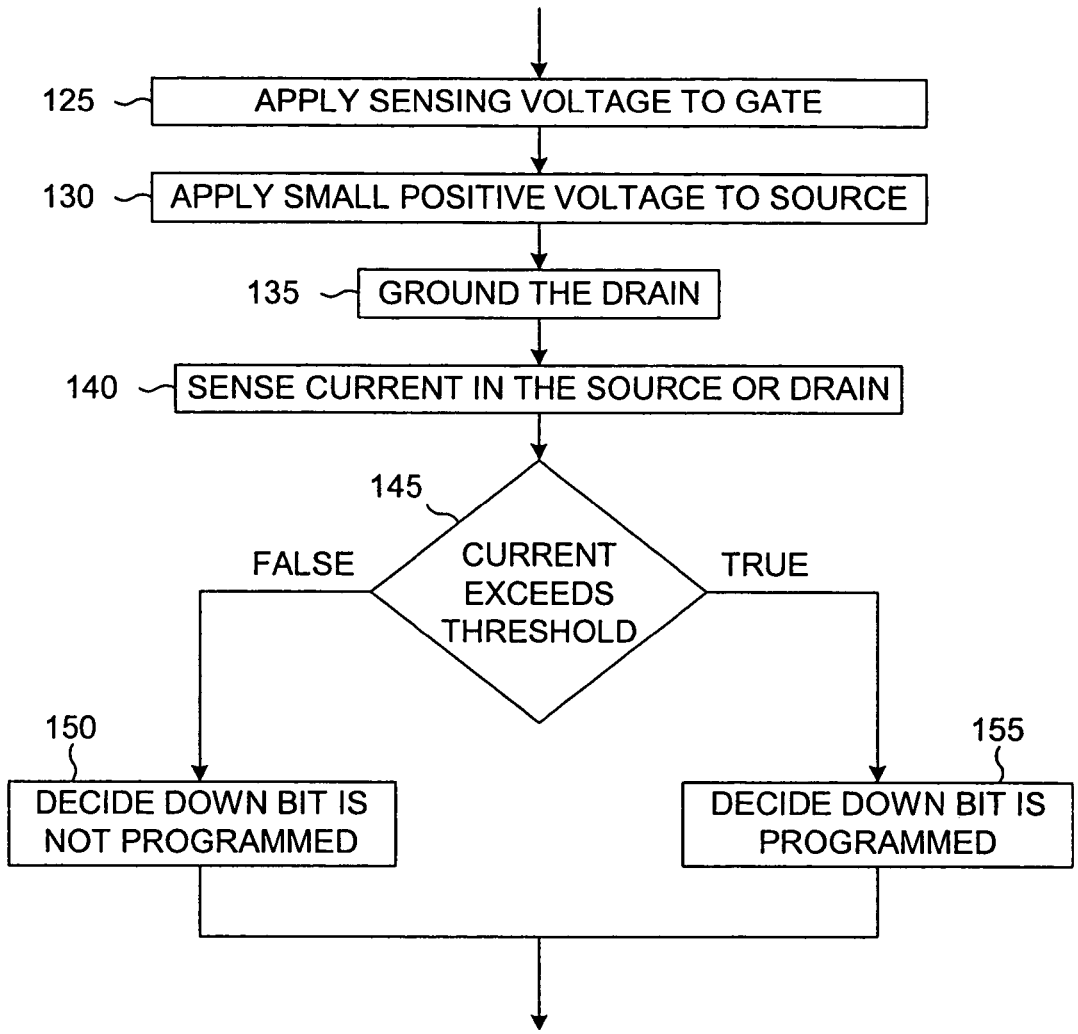
FIG. 9 is a flow diagram of an exemplary method of reading the down bit of an EEPROM cell according to the present invention.

FIG. 9 is a flow diagram of an exemplary method of reading the down bit of an EEPROM cell according to the present invention. One implementation of this exemplary method parallels the method already described for reading the up bit, but with the roles of the source and the drain reversed. That is, the substrate again is grounded (or biased with a positive potential), and a sensing voltage again is applied to the gate of the EEPROM cell at step 125. A small positive voltage is applied to the source of the EEPROM cell at step 130. The drain of the EEPROM cell is grounded at step 135. With the above voltages applied, the current in the drain is sensed at step 140. Alternatively, the current in the source may be sensed. According to one implementation of the present method the sensed value of current is compared at step 145 with the threshold value already described. If the current does not exceed the threshold, a decision is made declaring that the down bit is not programmed at step 150. If the current exceeds the threshold, a decision is made declaring that the down bit is programmed at step 155. FIG. 4F illustrates the application of a sensing voltage 3045 to the gate (G) of the EEPROM cell with a small positive voltage 3050 applied to the source (S) and with the drain (D) grounded. Current sensor 3055 senses the source current.

The previous paragraphs have described methods for reading the up bit and the down bit of an EEPROM cell in terms of small positive voltages and sensing voltage. According to an exemplary embodiment, a sensing voltage represents about 3 volts. In other terms, a lower limit for the sensing voltage applied to the gate during reading is the voltage at which sufficient inversion is generated in the channel in a programmed bit. According to the exemplary embodiment just mentioned, a typical value of a small positive voltage is about 1.5 volts.

In various embodiments of the invention described herein, more than one EEPROM cell comprising a charge-trapping structure are used to store information. As already described, EEPROM cells are often arranged in either NOR or NAND configurations. From a density point of view, the NAND configuration is preferred. The NAND configuration also typically consumes less power than the NOR configuration.

Figure 10:
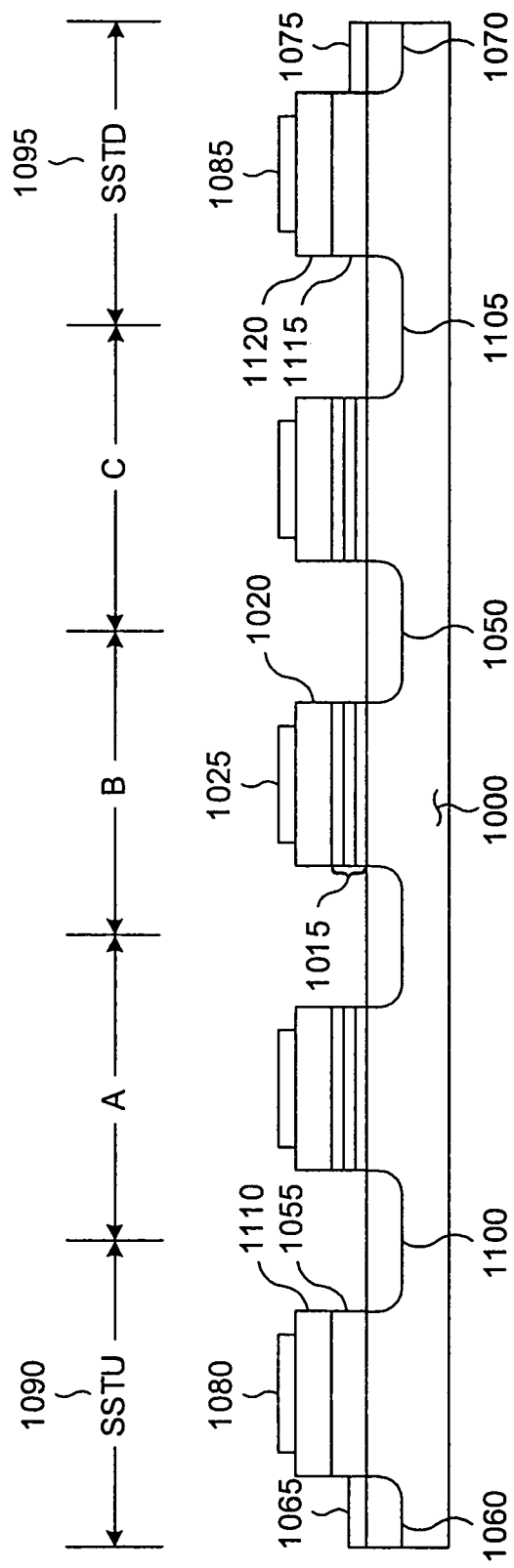
FIG. 10 is a cross-sectional diagram of an exemplary embodiment of a NAND configuration of EEPROM cells according to the present invention.

FIG. 10 is a cross-sectional diagram of an exemplary embodiment of a NAND configuration of EEPROM cells according to the present invention. For convenience, only three EEPROM cells (the middle three transistors designated as A, B, and C) are illustrated. (The scope of the invention is not to be limited by the choice of three cells in this diagram.) The transistors in FIG. 10 are formed on a substrate 1000. A configuration of EEPROM cells of the form illustrated in FIG. 10 is herein referred to as a "string." The EEPROM cells in the present illustrative embodiment are connected in series, source to drain. In fact, the source region of one transistor acts as the drain region of an adjacent transistor. For example, the source 1050 of transistor C functions as the drain 1050 of transistor B. Likewise, the source of transistor B is the same as the drain of transistor A. In this way the EEPROM cells are connected in series without the need for wires or other external connections. Except for this sharing of source and drain, each EEPROM cell in the string is substantially identical to the EEPROM cell considered above. That is, each EEPROM cell comprises a charge-trapping structure 1015, a gate 1020, and a gate contact 1025 configured as already described.

The present exemplary embodiment includes two additional transistors (1090, 1095) that are formed on the same substrate 1000. These transistors (1090, 1095) are disposed on the two ends of the string of EEPROM cells (A, B, C). The transistor 1090 on the left is referred to as an up string select transistor (SSTU), and the transistor 1095 on the right is referred to as a down string select transistor (SSTD). The SSTU 1090 comprises a source 1060 disposed in the substrate 1000 and further comprises a source contact 1065, which may be used to provide an external connection to the source 1060. Such an external connection is herein referred to as an up bit line (BLU). The drain 1100 of the SSTU 1090 is the same as the source 1100 of the left EEPROM cell (A). The SSTU 1090 further comprises a channel formed in the substrate 1000 between the source 1060 and the drain 1100. The SSTU 1090 still further comprises an insulating layer 1055 that overlies the channel, and also comprises a gate 1110 and a gate contact 1080. The gate 1110 overlies the insulating layer 1055. The gate contact 1080 may be used to provide an external connection to the gate 1110. Such an external connection is herein referred to as an up string select line (SSLU).

The SSTD 1095 on the right mirrors the form of the SSTU 1090 on the left of the diagram. The SSTD 1095 comprises a drain 1070 disposed in the substrate 1000. The SSTD 1095 further comprises a drain contact 1075, which may be used to provide an external connection to the drain 1070. Such an external connection is herein referred to as a down bit line (BLD). The source 1105 of the SSTD 1095 is the same as the drain 1105 of the right EEPROM cell (C). The SSTD 1095 further comprises a channel that forms in the substrate 1000 between the source 1105 and the drain 1070. The SSTD 1095 still further comprises an insulating layer 1115 that overlies the channel. The SSTD 1095 also comprises a gate 1120 and a gate contact 1085. The gate 1120 overlies the insulating layer 1115, and the gate contact 1085 may be used to provide an external connection to the gate 1120. Such an external connection is herein referred to as a down string select line (SSLD).

Each EEPROM cell in the diagram comprises a gate contact 1025 substantially identical to the gate contact 1025 provided on the EEPROM cell already described. Each gate contact 1025 may be used to provide an external connection to the gate of each EEPROM cell. This external connection is herein referred to as a word line.

For convenience, EEPROM cells may be indexed from left to right in a diagram similar to FIG. 10. In general, the EEPROM cells may be indexed from 1 to n. In the present diagram, EEPROM cell (A) has index 1, EEPROM cell (B) has index 2, and EEPROM cell (C) has index n where n is 3 in this simple example. For further convenience, the word line connected to the gate contact 1025 of each EEPROM cell also may be indexed according to the index of the EEPROM cell to which the word line is connected. Accordingly, in the present diagram the word line connected to EEPROM cell (A) has index 1, the word line connected to EEPROM cell (B) has index 2, and EEPROM cell (C) has index n where, again, n is 3 in the present example. The value of n=3 as described herein is not intended to limit the scope of the present invention or of the appended claims.

Figure 11:
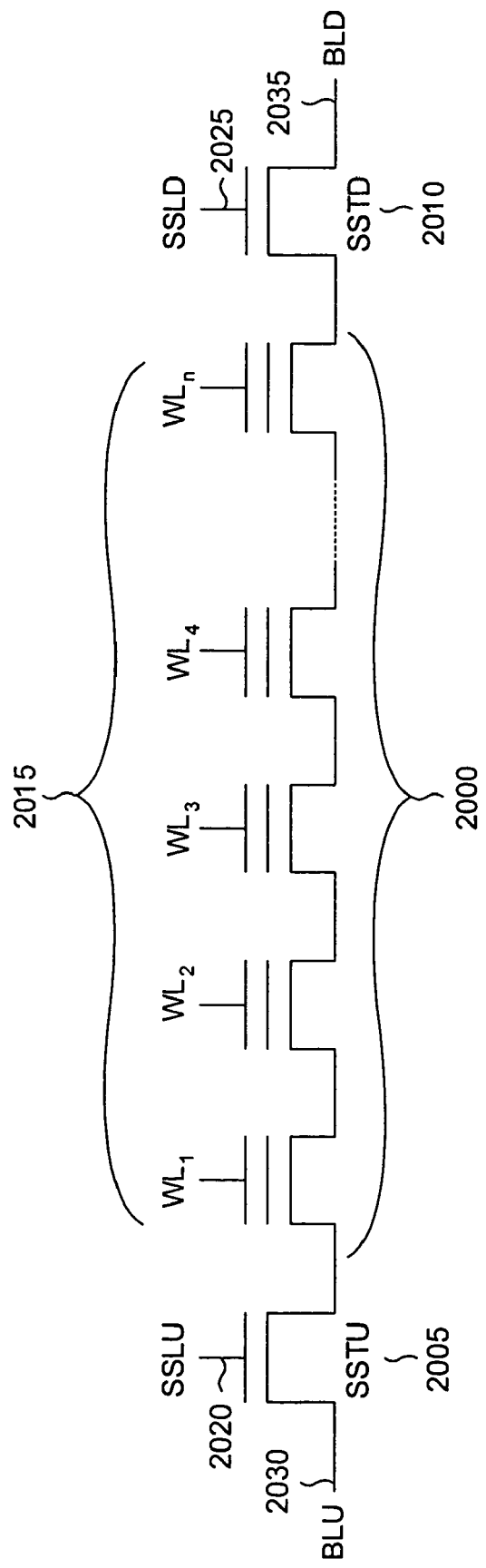
FIG. 11 is a simplified schematic diagram of an illustrated embodiment of the NAND string represented in FIG. 10.

FIG. 11 is a simplified schematic diagram of an alternative embodiment of the NAND string represented in FIG. 10. This embodiment comprises n EEPROM cells 2000 connected in series disposed between an up string select transistor (SSTU) 2005 and a down string select transistor (SSTD) 2010. The gate of each EEPROM cell connects to an individual word line 2015 (indexed from 1 to n as described supra). The gate of SSTU 2005 connects to an up string select line (SSLU) 2020, and the gate of the SSTD 2010 connects to a down string select line (SSLD) 2025. The source of the SSTU 2005 connects to an up bit line (BLU) 2030. Likewise, the drain of the SSTD 2010 connects to a down bit line (BLD) 2035. Each of the transistors in FIG. 11 is fabricated on the same substrate (not shown), which as presently embodied is held at ground potential. In the sequel, references to FIG. 11 assume that voltages are defined with respect to ground.

A method of operating EEPROM cells in a NAND string will now be described with reference to the above-described FIGS. 10 and 11 and with further reference to FIGS. 12–18.

Figure 12:
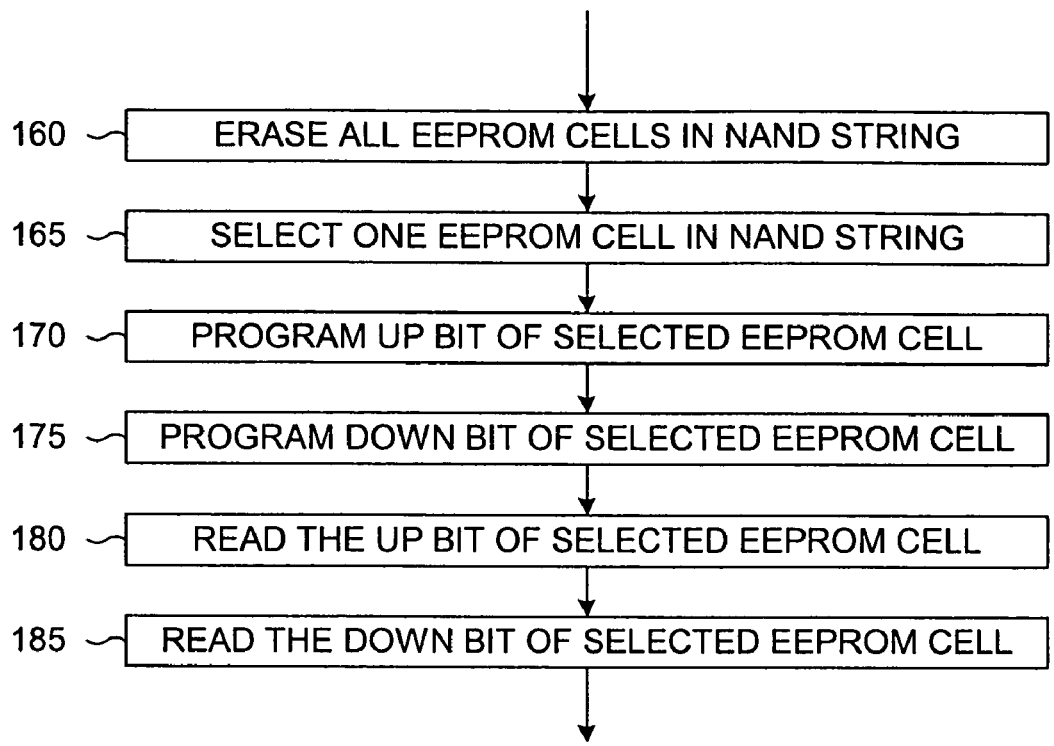
FIG. 12 is a flow diagram of an exemplary method of operating an EEPROM cell that is a member of a NAND string according to the present invention.

FIG. 12 is a flow diagram of an exemplary method of operating an EEPROM cell that is a member of a NAND string according to the present invention. According to an embodiment of this exemplary method, all EEPROM cells in the NAND string are erased at step 160. Once all cells are erased, an EEPROM cell is identified for further consideration at step 165. The up bit of the selected EEPROM cell then may be programmed at step 170. The down bit of the selected EEPROM cell likewise may be programmed. The up bit of the selected EEPROM cell may be read at step 180, and the down bit of the selected EEPROM cell may be read at step 185.

Figure 13:
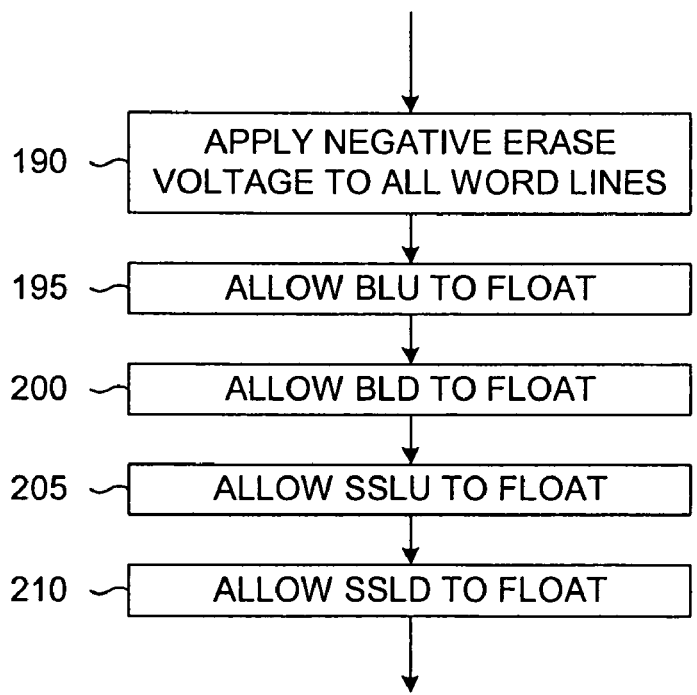
FIG. 13 is a flow diagram of an exemplary method of erasing an EEPROM cell that is a member of a NAND string according to the present invention.

FIG. 13 is a flow diagram of an exemplary method of erasing a plurality of EEPROM cells of a NAND string according to the present invention. One embodiment of this exemplary method follows the guidelines set forth in the description of a method of erasing an EEPROM cell standing alone (rather than comprising part of a string). That method was described in the discussion of FIG. 3 and further illustrated in FIG. 4A. An implementation of this exemplary method applies a negative erase voltage to all word lines as indicated at step 190. The up bit line (BLU) is allowed to float at step 195, and the down bit line (BLD) also is allowed to float at step 200. Further, the up string select line (SSLU) is allowed to float at step 205, and the down string select line (SSLD) is likewise allowed to float as shown by step 210. Applying negative word-line-to-substrate erase voltage (about −18 volts in one exemplary embodiment) to all word lines applies negative erase voltage to the gates of all the EEPROM cells. Each cell is affected as described supra. For example, with reference to FIG. 10, an excess of electrons is injected from each gate 1020 and becomes trapped in the charge-trapping layer of the charge-trapping structure 1015, thereby placing each EEPROM cell in an erased state.

Figure 14:
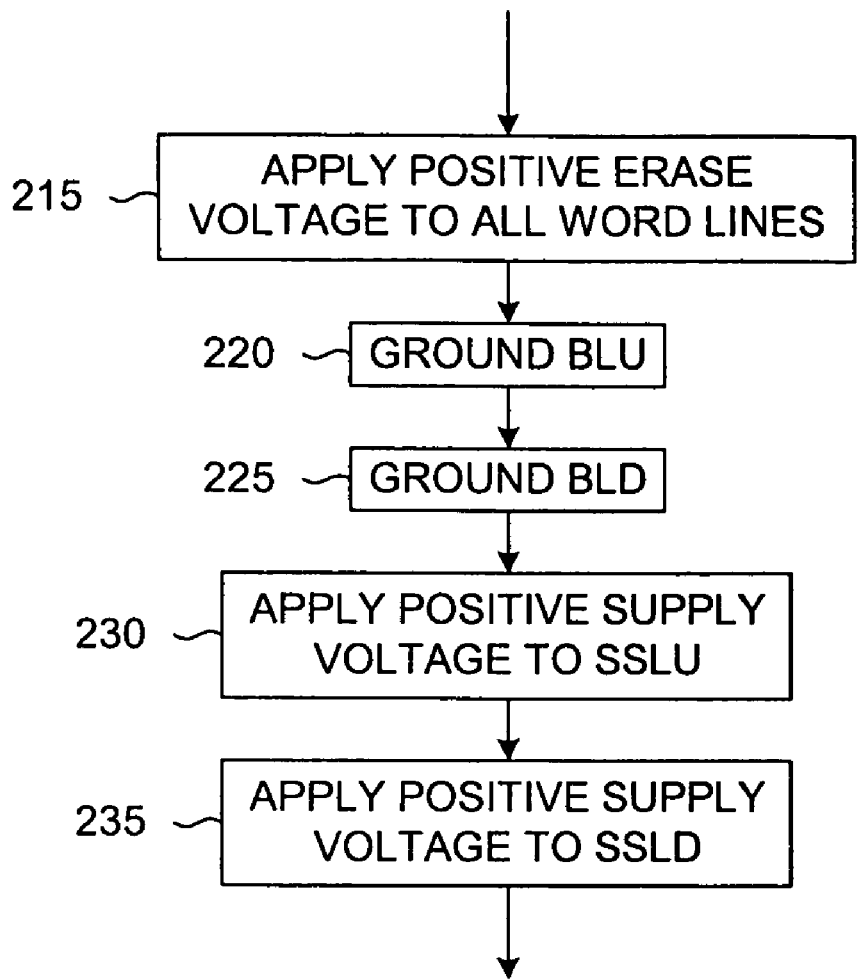
FIG. 14 is a flow diagram of an alternative exemplary method of erasing an EEPROM cell that is a member of a NAND string according to the present invention.

FIG. 14 is a flow diagram of an alternative exemplary method of erasing a plurality of EEPROM cells of a NAND string according to the present invention. One implementation of this exemplary method follows the method of erasing an EEPROM cell standing alone as described in the discussion of FIG. 5. According to the present exemplary method, a positive erase voltage (about 18 volts in an illustrated embodiment) is applied to all word lines at step 215. The up bit line (BLU) and down bit line (BLD) are both grounded at steps 220 and 225. A positive supply voltage (about 5 volts in the illustrated embodiment) is applied to the up string select line (SSLU) at step 230, and a positive supply voltage also is applied to the down string select line (SSLD) at step 235.

With reference to FIG. 11, the BLU 2030 and the BLD 2035 are grounded. Applying positive voltage to the gates of the SSTU 2005 and SSTD 2010 causes the SSTU 2005 and SSTD 2010 to behave as approximate short circuits. Therefore the source of the first EEPROM cell (connected to word line $WL_1$) is also approximately grounded. Similarly, the drain of the nth EPROM cell (connected to word line $WL_n$) is approximately grounded as well. With a large positive voltage applied to the word line (and hence the gate) of each EEPROM cell, each cell also is an approximate short circuit. Therefore, every EEPROM cell in the string is in a state substantially identical to the state of the EEPROM in FIG. 2 when its source and drain are grounded. This state was considered in the description of FIG. 5 and further illustrated in FIG. 4B. Accordingly, each EEPROM cell in FIG. 11 becomes erased due to an excess of electrons that are injected from the substrate 1000 and become trapped in the charge-trapping layer of the charge-trapping structure 1015. In a modified embodiment, the voltages applied to the BLU 2030 and the BLD 2035 are allowed to be equal to the voltage of the substrate.

Figure 15:
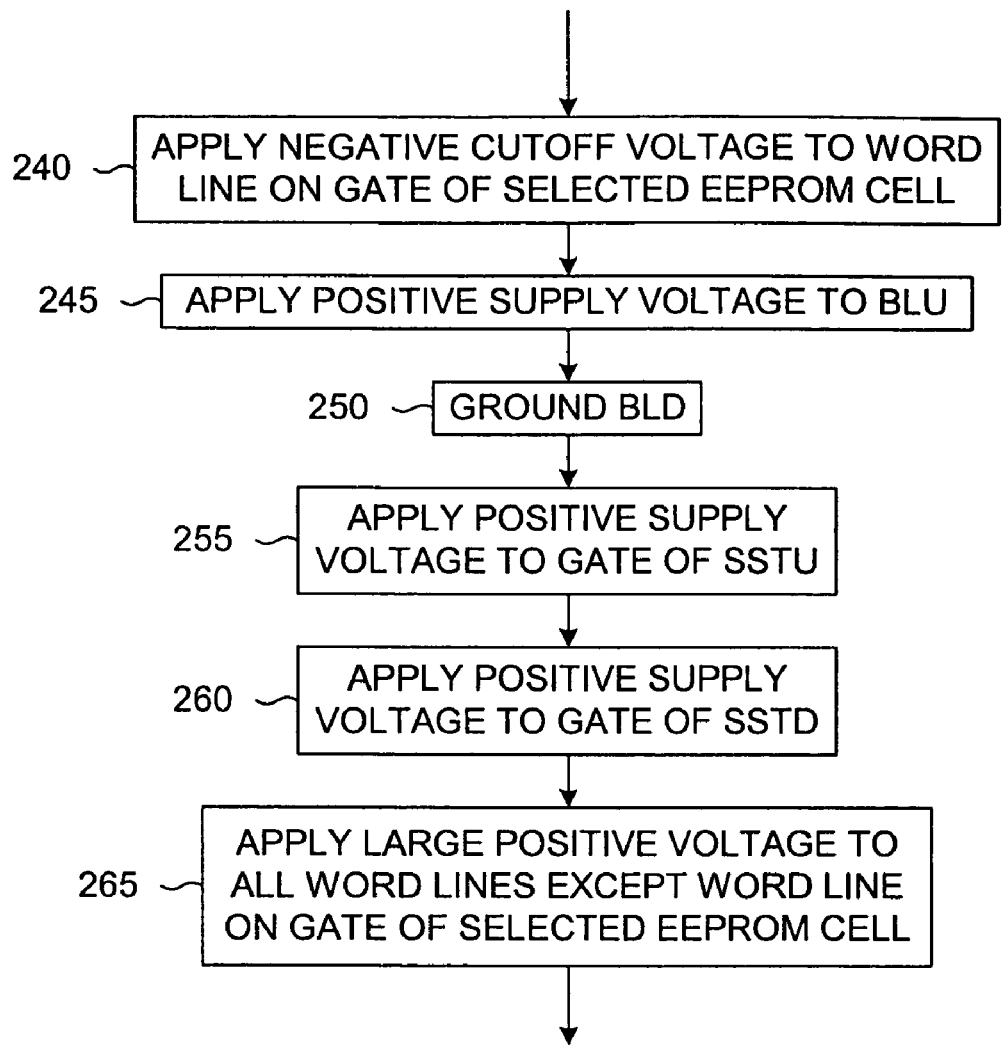
FIG. 15 is a flow diagram of an exemplary method of programming the up bit of an EEPROM cell that is a member of a NAND string according to the present invention.

FIG. 15 is a flow diagram of an exemplary method of programming the up bit of an EEPROM cell that is a member of a NAND string according to the present invention. One implementation of this exemplary method follows the exemplary method of programming the up bit of an EEPROM cell standing alone as described in the discussion of FIG. 6 and illustrated in FIG. 4C. According to the present exemplary method, an EEPROM cell to be programmed is selected, and a negative cutoff voltage is applied to the word line connected to the gate of the selected EEPROM cell at step 240. A positive supply voltage is applied to the up bit line (BLU) at step 245. The down bit line (BLD) is grounded at step 250. The positive supply voltage is applied to the gate of the up string select transistor (SSTU) at step 255 and to the gate of the down string select transistor (SSTD) at step 260. A large positive voltage is applied to all word lines except the word line connected to the gate of the selected EEPROM cell being programmed at step 265.

To see that this exemplary method follows the teachings in the discussion of FIG. 6, observe that a negative cutoff voltage is applied to the gate of the EEPROM cell to be programmed in both cases. In the present method, applying a positive supply voltage to the gates of the SSTU 2005 and the SSTD 2010 has the effect of causing the SSTU 2005 and SSTD 2010 to appear as approximate short circuits. These approximate short circuits connect the string of EEPROM cells to the positive supply voltage on the BLU and to ground on the BLD. With a large positive voltage applied to all word lines except the word line on the gate of the selected EEPROM cell, all EEPROM cells except the one being programmed likewise appear to be approximate short circuits. The positive supply voltage on the BLU therefore appears (approximately) on the source of the selected EEPROM cell. Similarly, the ground potential on the BLD appears (approximately) on the drain of the selected EEPROM cell. An equivalent circuit for the string state just described is noted to match FIG. 4C.

Figure 16:
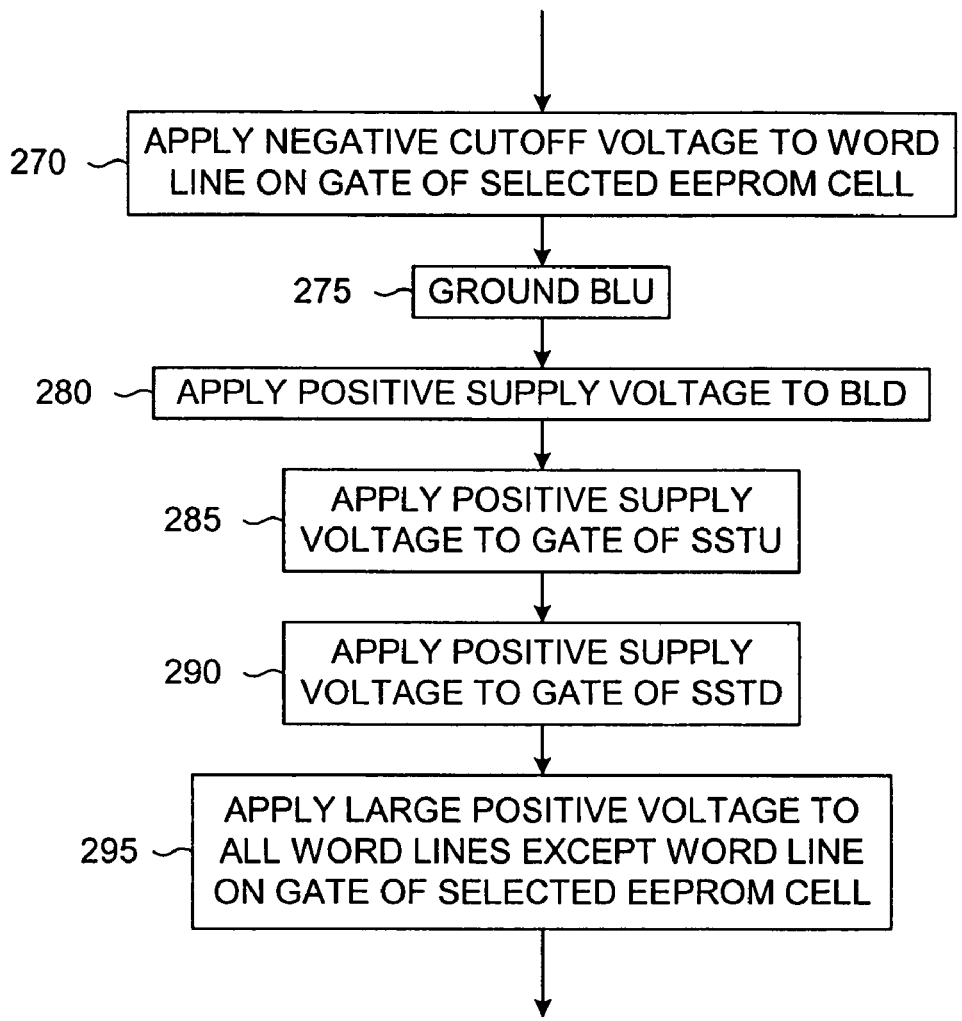
FIG. 16 is a flow diagram of an exemplary method of programming the down bit of an EEPROM cell that is a member of a NAND string according to the present invention.

FIG. 16 is a flow diagram of an exemplary method of programming the down bit of an EEPROM cell that is a member of a NAND string according to the present invention. One implementation of this method follows the method of programming the down bit of an EEPROM cell standing alone. That method was described in the discussion of FIG. 7 and further was illustrated in FIG. 4D. According to the present exemplary method, an EEPROM cell to be programmed is selected, and a negative cutoff voltage is applied to the word line connected to the gate of the selected EEPROM cell at step 270. The up bit line (BLU) is grounded at step 275. A positive supply voltage is applied to the down bit line (BLD) at step 280. The positive supply voltage is applied to the gate of the up string select transistor (SSTUD) at step 285 and to the gate of the down string select transistor (SSTD) at step 290. A large positive voltage is applied to all word lines except the word line connected to the gate of the EEPROM cell being programmed at step 295. To see that this exemplary method follows the teachings in the discussion of FIG. 7, observe that a negative cutoff voltage is applied to the gate of the EEPROM cell to be programmed in both cases. Applying a positive supply voltage to the gates of the SSTU 2005 and the SSTD 2010 has the effect of causing the SSTU 2005 and SSTD 2010 to appear as approximate short circuits. The approximate short circuits act to connect the string of EEPROM cells to the positive supply voltage on the BLD and to ground on the BLU. With a large positive voltage applied to all word lines except the word line on the gate of the selected EEPROM cell, all EEPROM cells except the one being programmed likewise essentially appear to be short circuits. The positive supply voltage on the BLD therefore appears (approximately) on the drain of the selected EEPROM cell. Similarly, the ground potential on the BLU appears (approximately) on the source of the selected EEPROM cell. A substantially equivalent circuit for the string state just described is noted to match FIG. 4D.

Figure 17:
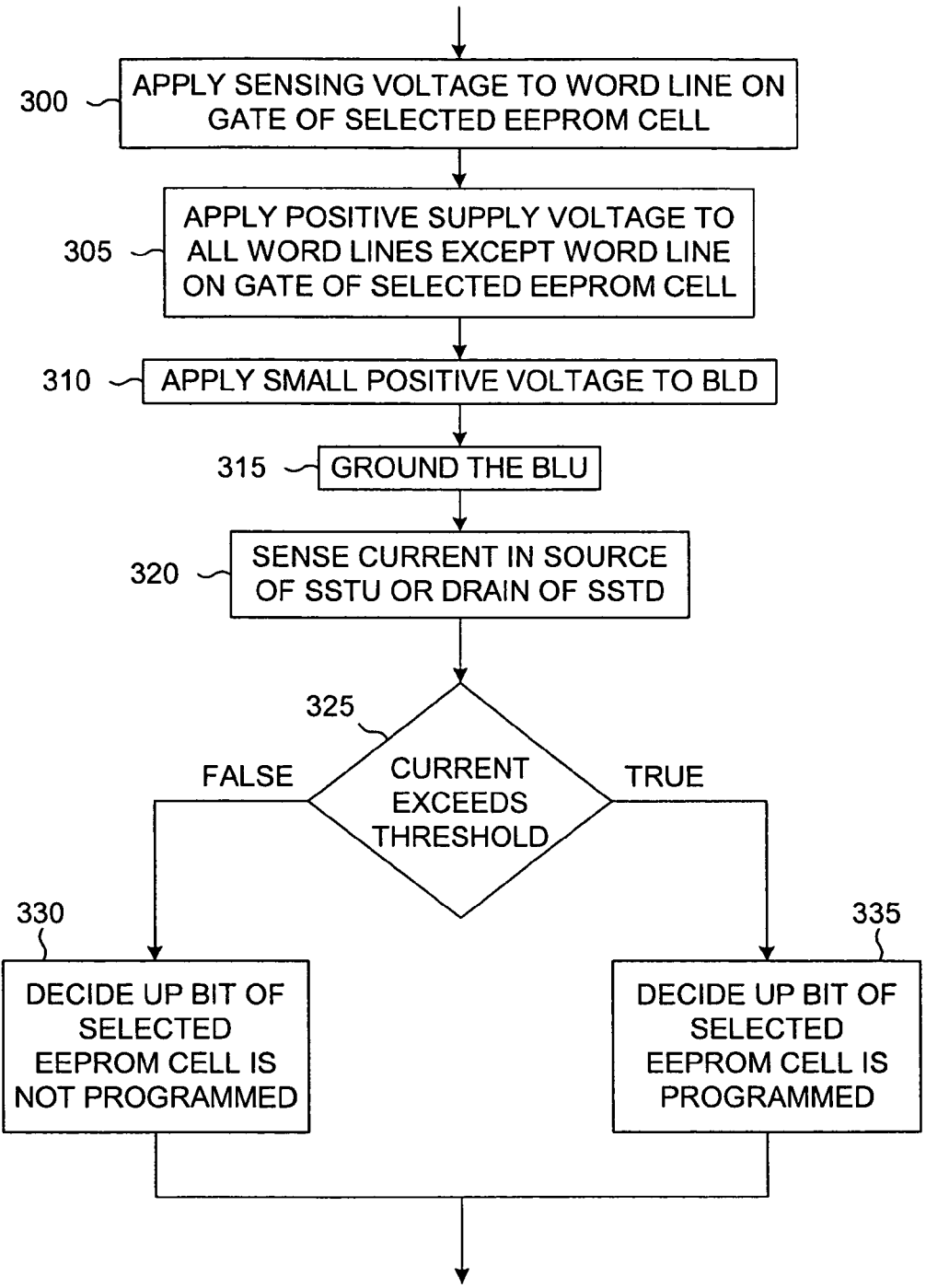
FIG. 17 is a flow diagram describing an exemplary method of reading the up bit of an EEPROM cell that is a member of a NAND string according to the present invention.

FIG. 17 is a flow diagram that describes an exemplary method of reading the up bit of an EEPROM cell that is a member of a NAND string according to the present invention. As in the previous situations described herein, an implementation of the present exemplary method follows the exemplary method of reading the up bit of an EEPROM cell standing alone as described in the discussion of FIG. 8 and illustrated in FIG. 4E. According to the present exemplary method, a sensing voltage is applied to the word line connected to the gate of the selected EEPROM cell at step 300. A positive supply voltage is applied to all word lines except the word line connected to the gate of the selected EEPROM cell at step 305, and a small positive voltage is applied to the down bit line (BLD) at step 310. The up bit line (BLU) is grounded at step 315, and the current in the source of the up string select transistor (SSTU) is sensed at step 320. Alternatively, the current in the drain of the down string select transistor (SSTD) may be sensed at step 320. The sensed current is compared with a chosen threshold at step 325. If the current is less than the threshold, then the up bit of the selected EEPROM cell is declared to be not programmed at step 330. If the current exceeds the threshold, then the up bit of the selected EEPROM cell is declared to be programmed at step 335. To see that this exemplary method follows the teachings in the discussion of FIG. 8, observe that a sensing voltage is applied to the gate of the selected EEPROM cell in both cases. Applying positive supply voltage to the remaining word lines causes all other EEPROM cells to act substantially as short circuits. Therefore, the small positive voltage applied to the down bit line (BLD) essentially appears at the drain of the selected EEPROM cell. Similarly, the ground potential of the up bit line (BLU) essentially appears at the source of the selected EEPROM cell. An equivalent circuit for the string state just described is noted to match FIG. 4E. Sensing the current in the BLD of the NAND string is substantially equivalent to sensing the current in the drain of the EEPROM cell in FIG. 4E.

Figure 18:
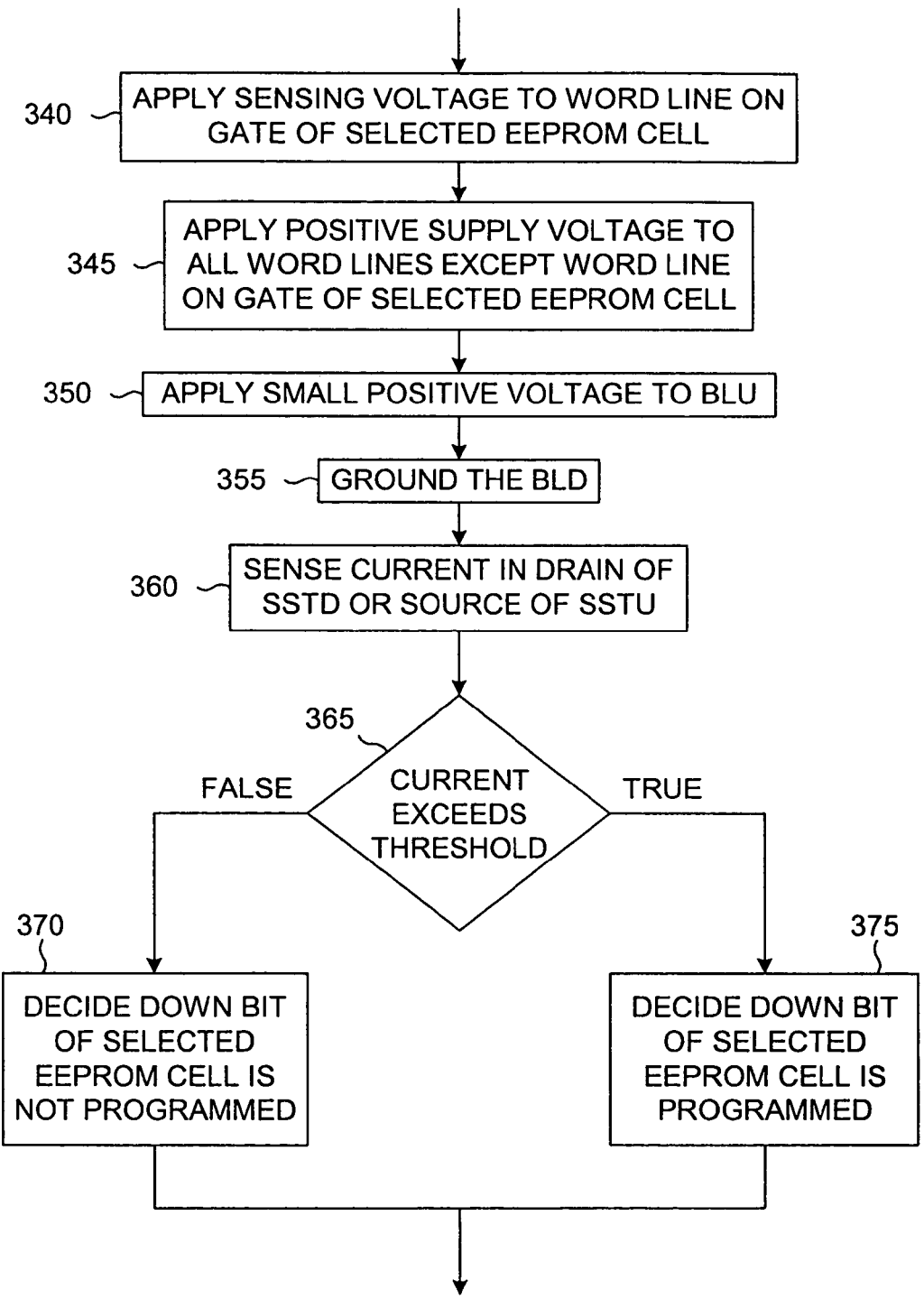
FIG. 18 is a flow diagram that describes an exemplary method of reading the down bit of an EEPROM cell that is a member of a NAND string according to the present invention.

FIG. 18 is a flow diagram that describes an exemplary method of reading the down bit of an EEPROM cell that is a member of a NAND string according to the present invention. As in the previous situations presented herein, one implementation of the present exemplary method follows the exemplary method of reading the down bit of an EEPROM cell standing alone. That exemplary method was described in the discussion of FIG. 9 and was further illustrated in FIG. 4F. According to the present exemplary method, a sensing voltage is applied to the word line connected to the gate of the selected EEPROM cell at step 340. A positive supply voltage is applied to all word lines except the word line connected to the gate of the selected EEPROM cell at step 345. A small positive voltage is applied to the up bit line (BLU) at step 350. The down bit line (BLD) is grounded at step 355. The current in the drain of the down string select transistor (SSTD) is sensed at step 360. According to an alternative embodiment, the current in the source of the up string select transistor (SSTU) is sensed at step 360. The sensed current is compared with a chosen threshold at step 365. If the current does not exceed the threshold, then the down bit of the selected EEPROM cell is declared to be not programmed at step 370. If the current exceeds the threshold, then the down bit of the selected EEPROM cell is declared to be programmed at step 375. To see that this exemplary method follows the teachings in the discussion of FIG. 9, observe that a sensing voltage is applied to the gate of the selected EEPROM cell in both cases. Applying positive supply voltage to the remaining word lines causes all other EEPROM cells to act substantially as short circuits. Therefore, the small positive voltage applied to the up bit line (BLU) essentially appears at the source of the selected EEPROM cell. Similarly, the ground potential of the down bit line (BLD) essentially appears at the drain of the selected EEPROM cell. An equivalent circuit for the string state just described is noted to match FIG. 4F. Sensing the current in the BLU of the NAND string is substantially equivalent to sensing the current in the source of the EEPROM cell in FIG. 4F.

Throughout the preceding description various voltage values have been introduced that have been characterized as small, large, sensing, and the like. Here, for reference, are representative values of the aforementioned voltages according to an exemplary embodiment of the present invention: A positive erasing voltage may have a value of approximately 18 volts. A negative erasing voltage may have a value of approximately −18 volts. A large positive voltage may have a value of approximately 10 volts. A positive supply voltage may have a value of approximately 5 volts. A negative cutoff voltage may have a value of approximately −5 volts. A sensing voltage may have a value of approximately 3 volts. A small positive voltage may have a value of approximately 1.5 volts. These voltage values are included only as examples and are not intended to limit the scope of the present invention.

Figure 19:
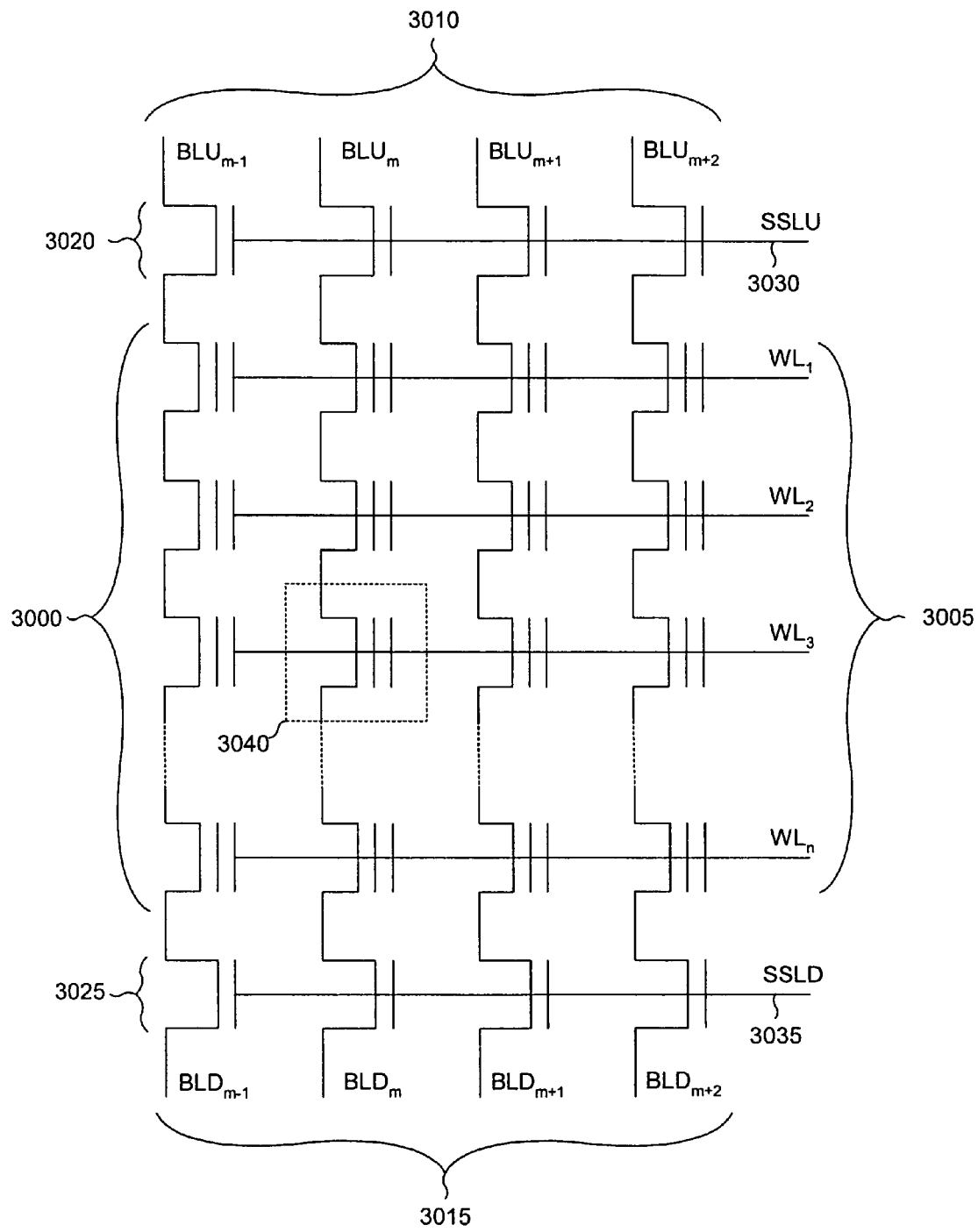
FIG. 19 is a schematic diagram of an embodiment of a NAND array in accordance with the present invention.

FIG. 19 is a schematic diagram of an embodiment of a NAND array. The NAND array in this embodiment comprises a collection of NAND strings of the type already described. Each NAND string comprises a series collection of EEPROM gates 3000, an up string select transistor (SSTU) 3020, and a down string select transistor (SSTD) 3025. Each NAND string further connects to an up bit line (BLU) 3010 and a down bit line (BLD) 3015. The NAND strings are indexed by integers with only four strings illustrated in FIG. 19. The figure shows only NAND strings m−1, m, m+1, and m+2 where m is an integer greater than one. Any number of NAND strings is possible, and the present illustration is not intended to limit the scope of the present invention.

Each NAND string in FIG. 19 comprises n EEPROM cells indexed from 1 to n. The gates of EEPROM cells having the same index are connected to a word line 3005 having the same index as the EEPROM cells to which it is connected. The gates of the up string select transistors (SSTU) 3020 are connected to an up string select line (SSLU) 3030. Likewise, the gates of the down string select transistors (SSTD) 3025 are connected to a down string select line (SSLD) 3035.

The teachings already presented herein should elucidate a method for operating an embodiment of a NAND array of the type illustrated in FIG. 19. For example, to erase all EEPROM cells in the NAND array, the variations of the method described in the discussions of FIG. 13 and FIG. 14 apply. As another example, to program the up bit of the EEPROM cell 3040 having index 3 in the mth NAND string of the NAND array in FIG. 19, the variation of the method described in the discussion of FIG. 15 applies. As still another example, to program the down bit of the EEPROM cell 3040 having index 3 in the mth NAND string of the NAND array in FIG. 19, the variation of the method described in the discussion of FIG. 16 applies. According to yet another example, the variation of the method described in the discussion of FIG. 17 teaches how to read the up bit of the EEPROM cell 3040 having index 3 in the mth NAND string of the NAND array in FIG. 19. According to still another example, the variation of the method described in the discussion of FIG. 18 teaches how to read the down bit of the EEPROM cell 3040 having index 3 in the mth NAND string of the NAND array in FIG. 19. In each of the previous examples cited, EEPROM cell 3040 having index 3 in the mth NAND string is selected by noting that word line 3 connects to the gate of EEPROM cell 3040, that the mth BLD and the mth BLU likewise are associated with EEPROM cell 3040.

In view of the foregoing, it will be understood by those skilled in the art that the methods of the present invention can facilitate formation and operation of read only memory devices, and in particular read only memory devices exhibiting dual bit cell architectures, in an integrated circuit. The above-described embodiments and variations of method have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method of operating a memory cell, comprising:
   providing an electrically erasable programmable read only memory (EEPROM) cell which has a charge-trapping structure and which is a member of a NAND string;
   erasing an up bit and a down bit of the EEPROM cell, the up bit and the down bit being disposed at different locations within the charge-trapping structure; and
   programming at least one of the up bit and the down bit of the EEPROM cell.

2. The method as set forth in claim 1, wherein the providing of an EEPROM cell comprises providing a transistor formed on a substrate with a source, a drain, a channel under the charge-trapping structure between the source and the drain, and a gate overlying the charge-trapping structure, wherein the charge-trapping structure comprises a first isolation layer overlying the channel, a charge-trapping layer overlying the first isolation layer, and a second isolation layer overlying the charge-trapping layer.

3. The method as set forth in claim 2, wherein the erasing comprises:
   applying a negative gate-to-substrate erase voltage;
   allowing the source to float; and
   allowing the drain to float, thereby causing electrons to be injected from the gate and to become trapped in the charge trapping structure.

4. The method as set forth in claim 2, wherein the erasing comprises applying a positive gate-to-substrate erase voltage, thereby causing electrons to be injected from the substrate and to become trapped in the charge trapping structure.

5. The method as set forth in claim 2, wherein the programming comprises programming the up bit which includes:
   applying a negative cutoff voltage to the gate;
   applying a positive supply voltage to the source;
   grounding the drain; and
   injecting holes into the charge trapping layer of the charge trapping structure near the source.

6. The method as set forth in claim 2, wherein the programming comprises programming the down bit which includes:
   applying a negative cutoff voltage to the gate;
   applying a positive supply voltage to the drain;
   grounding the source; and
   injecting holes into the charge trapping layer of the charge trapping structure near the drain.

7. The method as set forth in claim 2, further comprising:
   reading the up bit; and
   reading the down bit.

8. The method as set forth in claim 7, wherein the reading of the up bit comprises:
   applying a positive voltage to the gate;
   applying a positive voltage to the drain;
   grounding the source;
   sensing current;
   deciding that the up bit is programmed when the sensed current exceeds a threshold value; and
   deciding that the up bit is not programmed when the sensed current does not exceed the threshold value.

9. The method as set forth in claim 8, wherein the sensing of current comprises sensing current in the drain.

10. The method as set forth in claim 8, wherein the sensing of current comprises sensing current in the source.

11. The method as set forth in claim 7, wherein the reading of the down bit comprises:
applying a positive voltage to the gate;
applying a positive voltage to the source;
grounding the drain;
sensing current;
deciding that the down bit is programmed when the sensed current exceeds a threshold value; and
deciding that the down bit is not programmed when the sensed current does not exceed the threshold value.

12. The method as set forth in claim 11, wherein the sensing of current comprises sensing current in the source.

13. The method as set forth in claim 11, wherein the sensing of current comprises sensing current in the drain.

14. The method as set forth in claim 2, wherein the NAND string comprises a series connection of n EEPROM cells connected source to drain, each of the EEPROM cells in the NAND string being substantially identical to the provided EEPROM cell.

15. The method as set forth in claim 14, wherein:
the erasing comprises erasing up bits and down bits of all EEPROM cells in the NAND string;
the erasing is followed by identifying an EEPROM cell in the NAND string; and
the programming comprises programming at least one of an up bit and a down bit of the identified EEPROM cell.

16. The method as set forth in claim 15, wherein:
the EEPROM cells in the NAND string are consecutively indexed from one to n, with n being greater than one;
the NAND string has an up end and a down end;
the up end comprises an up string select transistor (SSTU); and
the down end comprises a down string select transistor (SSTD).

17. The method as set forth in claim 16, wherein:
the up string select transistor (SSTU) comprises a source and a drain formed in the substrate with a channel in the substrate between the source and drain, a dielectric layer that overlies the channel, and a gate that overlies the dielectric layer, the drain of the SSTU being connected to the source of an EEPROM cell having index one, the source of the SSTU being connected to an up bit line (BLU), and the gate of the SSTU being connected to an up string select line (SSLU);
the down string select transistor (SSTD) comprises a source and a drain formed in the substrate with a channel in the substrate between the source and drain, a dielectric layer that overlies the channel, and a gate that overlies the dielectric layer, the source of the SSTD being connected to the drain of an EEPROM cell having index n, the drain of the SSTD being connected to a down bit line (BLD), and the gate of the SSTD being connected to a down string select line (SSLD); and
a word line is connected to the gate of each EEPROM cell in the NAND string, each word line being indexed according to the index of the EEPROM cell to which the word line is connected.

18. The method as set forth in claim 17, wherein the erasing of all EEPROM cells comprises:
applying a negative erase voltage to all word lines;
allowing the BLU to float;
allowing the BLD to float;
allowing the SSLU to float; and
allowing the SSLD to float.

19. The method as set forth in claim 17, wherein the erasing of all EEPROM cells comprises:
applying a positive erase voltage to all word lines;
grounding the BLU;
grounding the BLD;
applying a positive supply voltage to the SSLU; and
applying a positive supply voltage to the SSLD.

20. The method as set forth in claim 17, wherein the programming comprises programming an up bit of the identified EEPROM cell by performing the following:
applying a negative cutoff voltage to the word line connected to the gate of the identified EEPROM cell;
applying a positive supply voltage to the BLU;
grounding the BLD;
applying a positive supply voltage to the gate of the SSTU;
applying a positive supply voltage to the gate of the SSTD; and
applying a large positive voltage to all word lines except the word line connected to the gate of the identified EEPROM cell.

21. The method as set forth in claim 17, wherein the programming comprises programming of a down bit of the identified EEPROM cell by performing the following:
applying a negative cutoff voltage to the word line connected to the gate of the identified EEPROM cell;
grounding the BLU;
applying a positive supply voltage to the BLD;
applying a positive supply voltage to the gate of the SSTU;
applying a positive supply voltage to the gate of the SSTD; and
applying a large positive voltage to all word lines except the word line connected to the gate of the identified EEPROM cell.

22. The method as set forth in claim 17, further comprising:
reading the up bit of the identified EEPROM cell; and
reading the down bit of the identified EEPROM cell.

23. The method as set forth in claim 22, wherein the reading of the up bit of the identified EEPROM cell comprises:
applying a sensing voltage to the word line connected to the gate of the identified EEPROM cell;
applying a positive supply voltage to all word lines except the word line connected to the gate of the identified EEPROM cell;
applying a positive voltage to the BLD;
grounding the BLU;
sensing current;
deciding that the up bit of the identified EEPROM cell is programmed when the sensed current exceeds a threshold value; and
deciding that the up bit of the identified EEPROM cell is not programmed when the sensed current does not exceed the threshold value.

24. The method as set forth in claim 23, wherein sensing current comprises sensing current in the source of the SSTD.

25. The method as set forth in claim 23, wherein sensing current comprises sensing current in the drain of the SSTU.

26. The method as set forth in claim 22, wherein the reading of the down bit of the identified EEPROM cell comprises:
applying a sensing voltage to the word line connected to the gate of the identified EEPROM cell;

applying a positive supply voltage to all word lines except the word line connected to the gate of the identified EEPROM cell;

applying a positive voltage to the BLU;

grounding the BLD;

sensing current;

deciding that the down bit of the identified EEPROM cell is programmed when the sensed current exceeds a threshold value; and deciding that the down bit of the identified EEPROM cell is not programmed when the sensed current does not exceed the threshold value.

27. The method as set forth in claim 26, wherein sensing current comprises sensing current in the drain of the SSTU.

28. The method as set forth in claim 26, wherein sensing current comprises sensing current in the source of the SSTD.

29. The method as set forth in claim 2, wherein the providing of a transistor comprises providing a transistor having a charge-trapping layer comprising nitride.

30. The method as set forth in claim 2, wherein the providing of a transistor comprises providing a transistor having a first isolation layer comprising silicon dioxide.

31. The method as set forth in claim 2, wherein the providing of a transistor comprises providing a transistor having a second isolation layer comprising silicon dioxide.

32. A NAND-type erasable programmable read only memory (EEPROM) device, comprising:

a plurality of substantially identical NAND strings formed in a substrate, each NAND string having an up end and a down end, wherein each NAND string comprises a plurality of EEPROM cells indexed from one to n connected in series and having up bits and down bits at different positions within charge-trapping structures, and wherein EEPROM cells having the same index connect to a word line identified by the same index as that of the EEPROM cells to which the word line is connected;

an up bit line associated with a NAND string;

a down bit line associated with a NAND string;

an up string select transistor disposed between the up end of a NAND string and the up bit line associated with the NAND string; and a down string select transistor disposed between the down end of a NAND string and the down bit line associated with the NAND string.

33. The NAND-type EEPROM device as set forth in claim 32, wherein each EEPROM cell is capable of storing two bits of information.

34. The NAND-type EEPROM device as set forth in claim 33, wherein each EEPPROM cell comprises a transistor formed on a substrate, the transistor comprising:

a source formed in the substrate;

a drain formed in the substrate;

a channel in the substrate between the source and drain;

a charge-trapping structure that overlies the channel, the charge-trapping structure including:

a first isolation layer overlying the channel; a charge-trapping layer overlying the first isolation layer; and a second isolation layer overlying the charge trapping layer; and a gate overlying the charge-trapping structure.

35. The NAND-type EEPROM device as set forth in claim 34, wherein the charge-trapping layer comprises nitride.

36. The NAND-type EEPROM device as set forth in claim 34, wherein the first isolation layer and the second isolation layer comprise silicon dioxide.

* * * * *